United States Patent [19]
Wang et al.

[11] Patent Number: 6,166,943
[45] Date of Patent: Dec. 26, 2000

[54] METHOD OF FORMING A BINARY CODE OF A ROM

[75] Inventors: Ping-Ying Wang, Hsin-Chu; Chun-Yi Yang, Hsin-Chu Hsien; Chun-Jung Lin, Hsin-Chu; Jui-Chin Chang, Tai-Chung Hsien; Mam-Tsung Wang, Hsin-Chu, all of Taiwan

[73] Assignee: Macronix International Co, Ltd, Hsin-Chu, Taiwan

[21] Appl. No.: 09/421,260

[22] Filed: Oct. 20, 1999

[30] Foreign Application Priority Data

Sep. 30, 1999 [CN] China .................................. 88116882

[51] Int. Cl.[7] .................................................. G11C 17/00
[52] U.S. Cl. .............................................. 365/94; 365/104
[58] Field of Search ............................ 365/94, 103, 104; 257/529, 530, 532, 538

[56] References Cited

U.S. PATENT DOCUMENTS

| | | | |
|---|---|---|---|
| 4,569,120 | 2/1986 | Stacy et al. ............................. | 365/94 |
| 4,590,589 | 5/1986 | Gezberg ................................... | 365/94 |
| 5,060,190 | 10/1991 | Chen et al. ............................. | 365/104 |
| 5,557,137 | 9/1996 | Cohen ....................................... | 365/94 |

*Primary Examiner*—Tan T. Nguyen
*Attorney, Agent, or Firm*—Winston Hsu

[57] ABSTRACT

The present invention provides a method of writing a set of binary codes into a ROM. The method is performed by forming a first photo mask and a second photo mask according to an original first code pattern, an original second code pattern, and a set of binary codes to be written into the ROM. Final first and second code patterns are formed by coupling the binary codes to be written with the original first and second code patterns by using a Boolean logical OR operation. The first and second photo masks are formed according to the final first and second code patterns. The first photolithographic process is performed using the first photo mask, and the first ion implantation process is performed; the second photolithographic process is performed using the second photo mask, and the second ion implantation process is performed. Thus the set of binary codes is written into the ROM completely and correctly.

10 Claims, 11 Drawing Sheets

METHOD OF FORMING A BINARY CODE OF A ROM

BACKGROUND OF THE INVENTION

1. Field of the Invention

The present invention relates to a method of forming a binary code of a read-only memory (ROM), and more particularity, to a method of writing a set of binary codes into a ROM.

2. Description of the Prior Art

A read-only memory (ROM) is a semiconductor device that comprises a plurality of memory cells for storing data. Each of the memory cells comprises a MOS transistor. The data held in the circuits of a ROM does not change in either power off or power on conditions. Consequently, the data stored in the ROM will not be lost if the power is turned off. This is also why the ROM can only be read.

The prior art method of forming a ROM involves arranging a plurality of MOS transistors in a matrix format on a predetermined area of a die. These MOS transistors are regarded as the memory cells for storing data. Some of them are enabled to indicate one binary state, whereas others are disabled to indicate the opposite binary state. To arrange these memory cells, a photo mask is formed according to a set of binary codes to be written into the ROM. Then, the pattern of the photo mask is transferred onto the ROM by performing a photolithography process to disable some of the MOS transistors. Therefore, the set of binary codes is written onto the ROM correctly, and the ROM, which is formed from a photo mask, is called Mask ROM.

Figure 1:
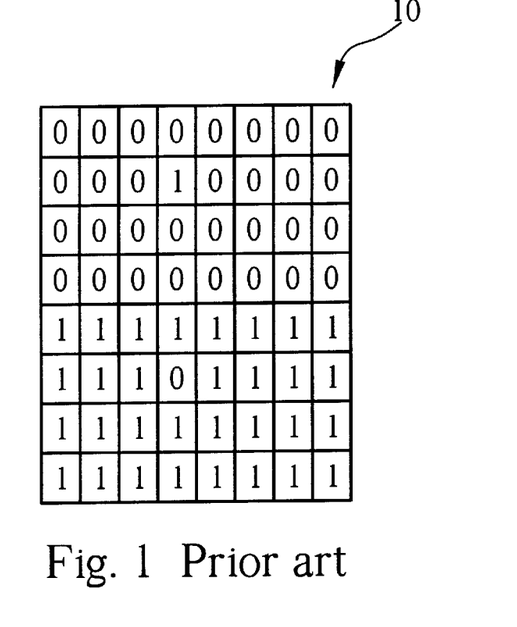
FIG. 1 is a schematic diagram of a set of binary codes for introducing a prior art method.
Figure 2:
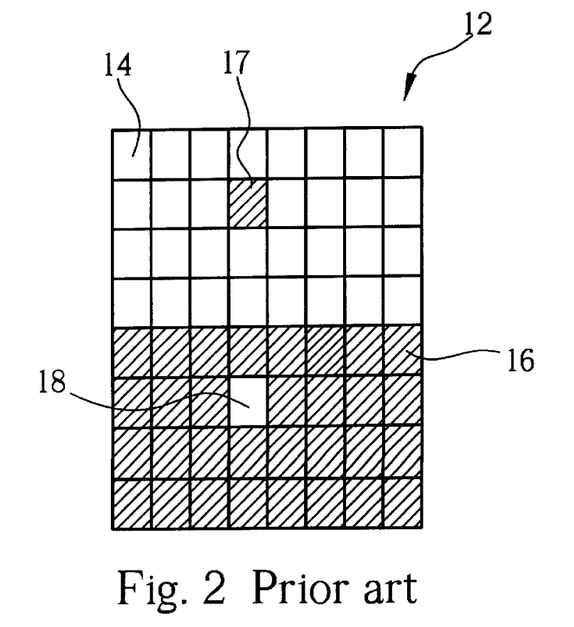
FIG. 2 is a schematic diagram of a photo mask formed according to the set of binary codes shown in FIG. 1

Please refer to FIG. 1 and FIG. 2. FIG. 1 is a schematic diagram of a set of binary codes 10 for introducing a prior art method. FIG. 2 is a schematic diagram of a photo mask 12 formed according to the set of binary codes 10 shown in FIG. 1. The set of binary codes 10 to be written into the ROM is arranged in a matrix format and corresponds to the same cell regions of the photo mask 12. These binary codes are either a 0 or a 1. The cell regions on the photo mask 12 are transparent if their corresponding binary code is 0 and opaque if their corresponding binary code is 1.

The prior art method of writing a set of binary codes 10 into a ROM is to transfer the pattern of the photo mask 12 onto the ROM by performing a photolithographic process. A photo mask 12 is formed by exposure and development processes. As shown in FIG. 2, the photo mask 12 comprises a plurality of cell regions arranged in a matrix format, and each of the cell regions can be either a transparent region 14 or an opaque region 16. These transparent and opaque regions will form patterns with "holes" 18 and/or "islands" 17.

Figure 3:
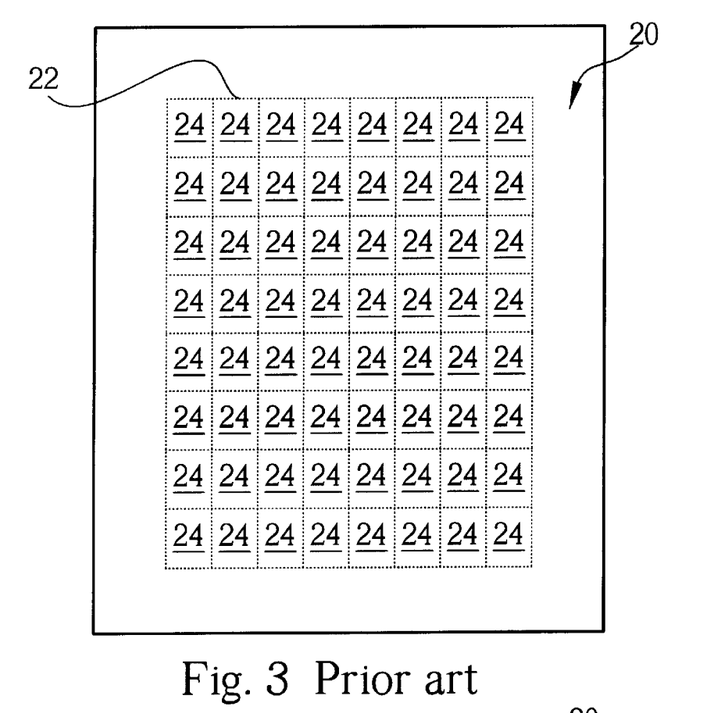
FIG. 3 to FIG. 5 are schematic diagrams of a method for writing the set of binary codes into a ROM.
Figure 4:
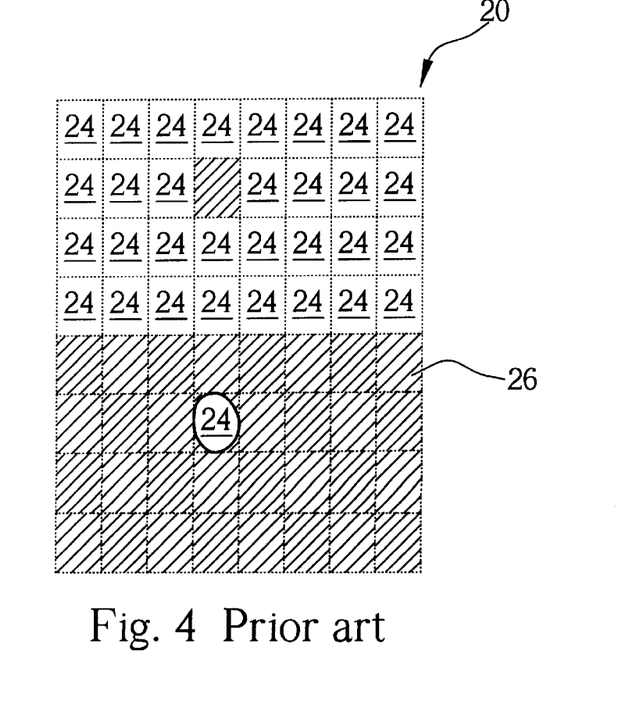
Figure 5:
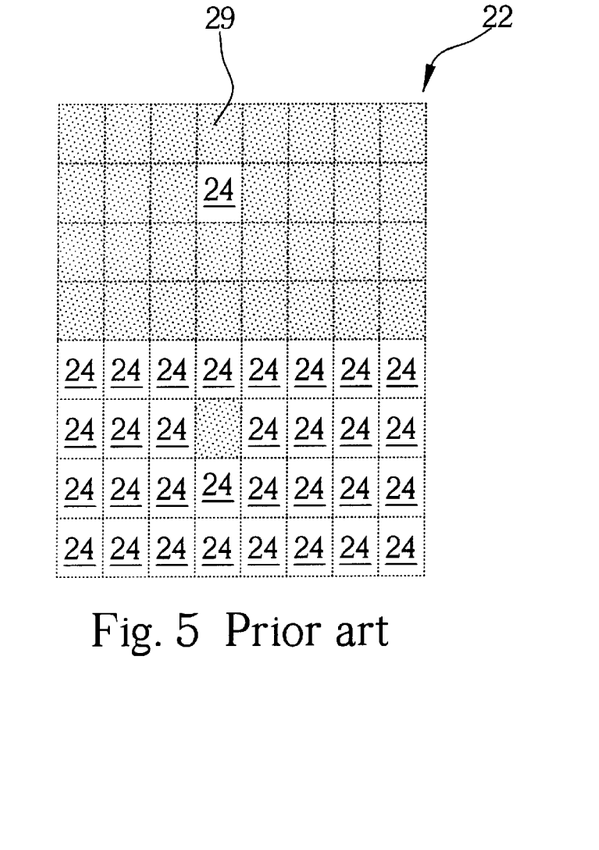

Please refer to FIG. 3 to FIG. 5. FIG. 3 to FIG. 5 are schematic diagrams of a method for writing the set of binary codes 10 into a ROM 22. As shown in FIG. 3, the ROM 22 is on a predetermined area of a die 20. The ROM 20 comprises a plurality of memory cells 24 arranged in a matrix format on the die 20, and each of the memory cells 24 comprises a MOS transistor (not shown). A prior art method for writing the set of binary codes 20 onto the ROM 22 is performed by forming a photo mask 12 according to the set of binary codes 10 to be written onto the ROM 22 and then transferring the pattern of the photo mask 12 onto the ROM by a photolithographic process. The cell regions arranged in a matrix format on the photo mask 12 correspond to the memory cells 24 of the ROM 22.

As shown in FIG. 4, the photolithographic process is performed using the photo mask 12, and a photoresist layer 26 is formed on the ROM 22. The memory cells 24 corresponding to the opaque regions 16 of photo mask 12 are covered by the photoresist layer 26. After that, an ion implantation process is performed which will implant the memory cells 24 not covered with the photoresist layer 26 with dopants. Consequently, an ion implantation area 29 is formed (FIG. 5). After removing the photoresist layer 26, the photolithographic process is complete. The gate threshold voltage of the MOS transistor in the ion implantation area 29 is raised. The MOS transistors in the ion implantation areas 29 thus become depletion transistors and can not be used. This fulfills the design requirements of the ROM 22.

Figure 6:
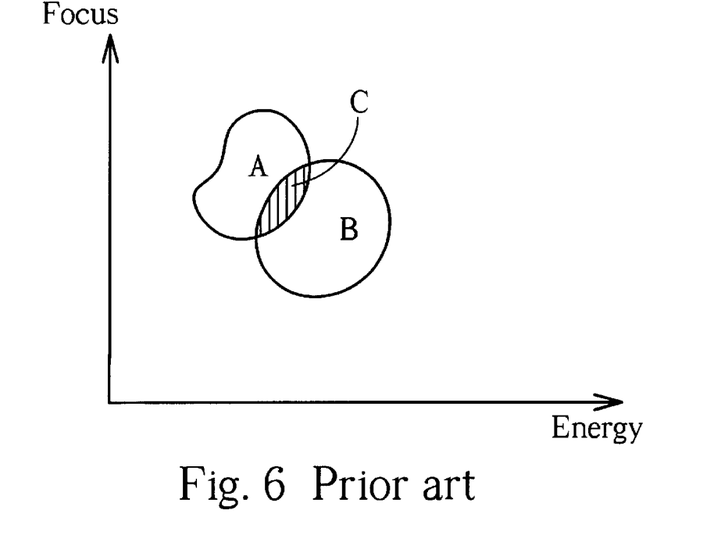
FIG. 6 is a graph showing the ranges of focus and exposure energy restrictions while performing the exposure process using the photo mask with a hole and an island on it.

Please refer to FIG. 6. FIG. 6 is a graph showing the ranges of focus and exposure energy restrictions while performing the exposure process using the photo mask with the hole 18 and the island 17. These transparent and opaque regions of the photo mask 12, resulting directly from the set of binary codes 10, will form holes 18 and islands 17. According to prior art results, the process restriction parameter ranges might not be the same for holes 18 and islands 17 while performing an exposure. As shown in FIG. 6, range A is the range of focus and exposure energy restrictions while performing an exposure using a photo mask with a hole (a transparent region); range B is the range of focus and exposure energy restrictions while performing an exposure using a photo mask with an island (an opaque region); range C is the range of focus and exposure energy restrictions while performing an exposure using a photo mask with both holes and islands. Because of the limits on the process, it is not easy to control the focus and the exposure energy to remain in range C. Therefore, optical proximity effects may easily occur while performing the exposure process using a photo mask with both holes and islands. In such cases, the pattern of the photo mask cannot be precisely transferred onto the ROM 22, and thus the set of binary codes 10 will also not be written onto the ROM 22 correctly.

It is very common for the prior art photo mask 12, formed directly according to the set of binary codes 10, to have holes 18 and islands 17. When performing the photolithographic process using a mask with these types of patterns, because of the restriction of process parameters, the information on the mask may not be properly transferred to the ROM MOS matrix, and thus the set of binary codes 10 will be written onto the ROM 22 incorrectly.

SUMMARY OF THE INVENTION

It is therefore a primary objective of the present invention to provide a method of forming a binary code of a ROM that can write a set of binary codes into a ROM precisely to solve the above-mentioned problem.

In a preferred embodiment, the present invention provides a method of writing a set of binary codes into a read-only memory (ROM). The ROM is formed on a die and comprises a plurality of memory cells arranged in a matrix format on the die. Each memory cell comprises a MOS transistor. The method comprises:

forming a first photo mask and a second photo mask which respectively comprises a plurality of cell regions arranged in a matrix format and corresponding to the plurality of memory cells respectively, each of the cell regions being set as a transparent region or an opaque region, the first photo mask and the second photo mask being formed by using an original first code pattern, an original second code pattern and the set of binary codes to be written into the ROM, the original first code pattern and the original second code pattern respectively comprising a set of binary codes arranged in a matrix format and corresponding to the cell regions of the two photo masks, each of the binary codes of the two code patterns corresponding to the same cell region being different from each other, each of the binary codes to be written into the ROM being coupled to each corresponding binary code of the two code patterns by using a Boolean logic OR operation so as to form a final first code pattern and a final second code pattern respectively, the first photo mask and the second photo mask being formed by using the final first code pattern and the final second code pattern respectively, wherein whether each of the cell regions on the first photo mask or on the second photo mask is a transparent region or an opaque region is decided by each corresponding binary code of the final first code pattern or the final second code pattern;

performing a first photolithography process by using the first photo mask to form a first photoresist layer on the memory cells of the ROM, the first photoresist layer comprising at least one hole and each hole in the first photoresist layer corresponding to a cell region of the first photo mask and being positioned on the surface of the memory cell corresponding to the cell region;

performing a first ion implantation process to implant dopants into the transistor in the memory cell under each hole of the first photoresist layer;

removing the first photoresist layer completely;

performing a second photolithography process by using the second photo mask to form a second photoresist layer on the memory cells of the ROM, the second photoresist layer comprising at least one hole and each hole in the second photoresist layer corresponding to a cell region of the second photo mask and being positioned on the surface of the memory cell corresponding to the cell region;

performing a second ion implantation process to implant dopants into the transistor in the memory cell under each hole of the second photoresist layer; and removing the second photoresist layer completely.

It is an advantage of the present invention that the method of forming a binary code of a ROM can write a set of binary codes into a ROM precisely.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 7:
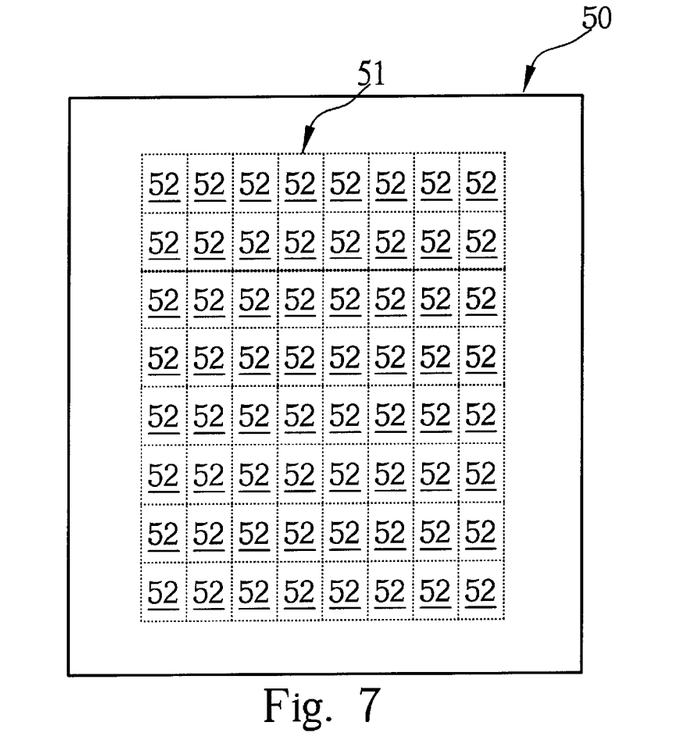
FIG. 7 is a schematic diagram of a ROM for performing the present invention method.
Figure 8:
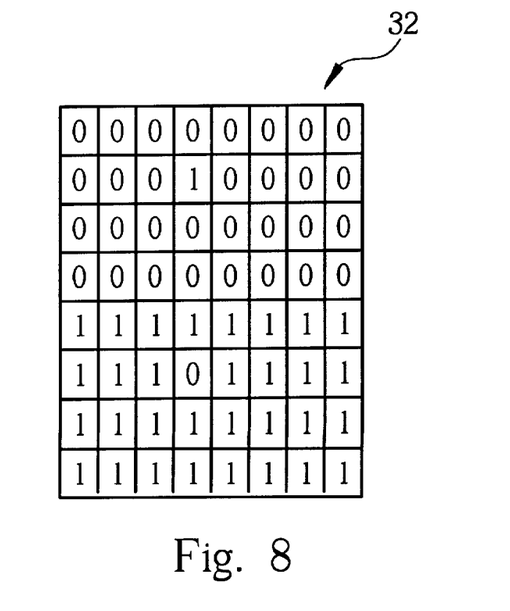
FIG. 8 is a schematic diagram of a set of binary codes for performing the present invention method.
Figure 9:
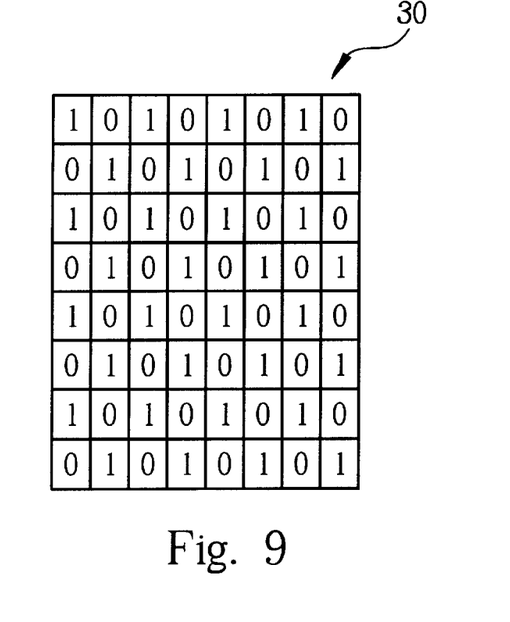
FIG. 9 and FIG. 10 are schematic diagrams of an original first code pattern and an original second code pattern respectively.
Figure 10:
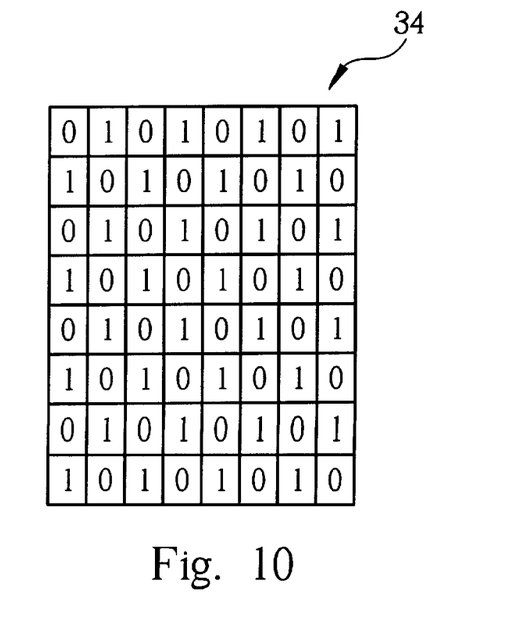

Please refer to FIG. 7 and FIG. 8. FIG. 7 is a schematic diagram of a ROM 51 for performing the present invention method. FIG. 8 is a schematic diagram of a set of binary codes 32 for performing the present invention method. The present invention is a method of writing the set of binary codes 32 into the ROM 51. The ROM 51 is formed on a predetermined area of a die 50, and comprises a plurality of memory cells 52 arranged in a matrix format on the die 50. Each memory cell 52 comprises an N-type transistor (not shown). The matrix format of the set of binary codes 32 to be written is based on different design requests. The set of binary codes 32 for introducing the present invention method is the same as the one used to introduce the prior art method.

Please refer to FIG. 9 to FIG. 14. The present invention method is performed by forming the final first code pattern 36 and the final second code pattern 38 according to the original first code pattern 30, the original second code pattern 34, and the set of binary codes 32 to be written into the ROM 51. Then the first photo mask 40 and the second photo mask 42 are formed according to the final first code pattern 36 and the final second code pattern 38, respectively. The original first code pattern 30 and the original second code pattern 34 respectively comprise a set of binary codes arranged in a matrix format and correspond to the cell regions of the two photo mask 40, 42. Each of the binary codes in the two code patterns 30, 34 is adjacent to four binary codes with a value different from itself, and each of the binary codes of the two code patterns 30, 34 that correspond to the same cell region are different from each other. In other words, the original first code pattern 30 is a series of alternating values in both the rows and columns of the matrix. The original second code pattern 34 is the logical NOT (inversion) of the original first code pattern 30.

Figure 11:
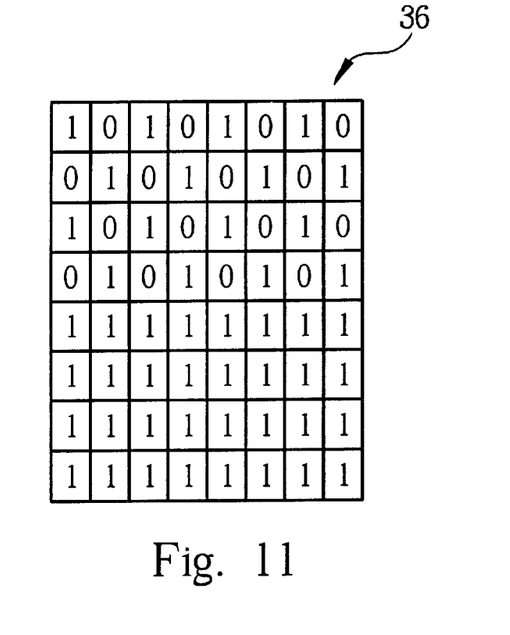
FIG. 11 and FIG. 12 are schematic diagrams of a final first code pattern and a final second code pattern respectively.
Figure 12:
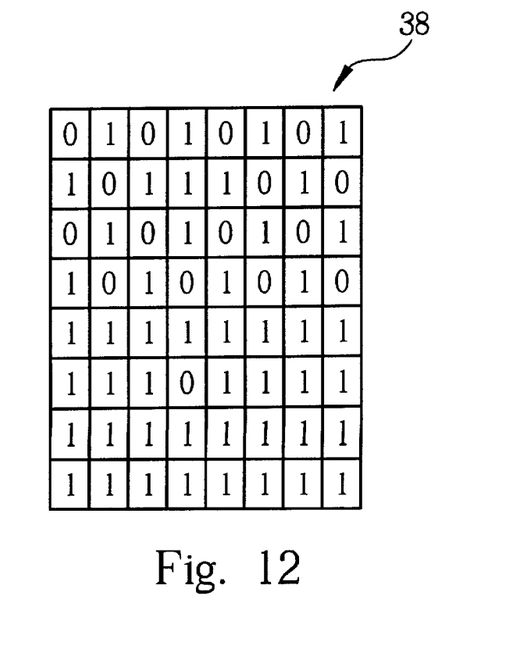

Before forming the first photo mask 40 and the second photo mask 42, each of the binary codes 32 to be written into the ROM is coupled to each corresponding binary code of the two code patterns 30, 34 by using a Boolean logical OR operation so as to form the final first code pattern 36 and a final second code pattern 38, respectively. That is to say, for a particular cell of the ROM 51, if the binary code in the set 32 corresponding to the cell and the corresponding binary code of the original first code pattern 30 have at least one '1' between them, then the corresponding binary code of the final first code pattern 36 will be a '1'; otherwise, it will be a '0'. The entire matrix of the final first code pattern 36 is formed in this way. The final second code pattern 38 is formed in a similar manner using the second original code pattern 38 instead of the original first code pattern 36.

Figure 13:
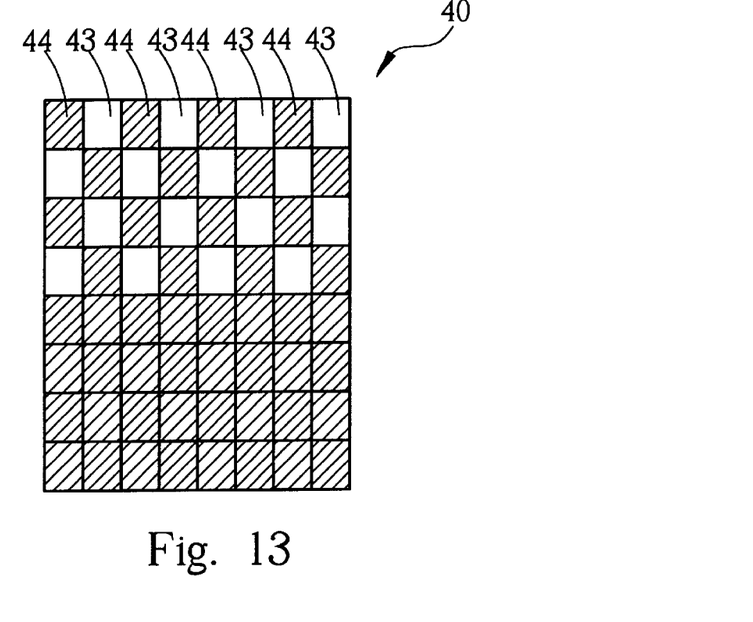
FIG. 13 is a schematic diagram of a first photo mask formed by using the final first code pattern shown in FIG. 11.
Figure 14:
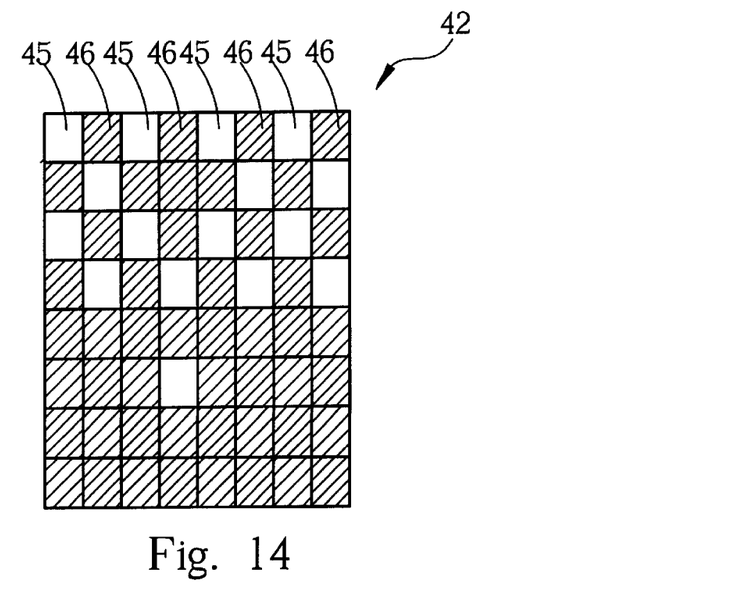
FIG. 14 is a schematic diagram of a second photo mask formed by using the final second code pattern shown in FIG. 12.

The first photo mask 40 and the second photo mask 42 are formed according to the final first code pattern 36 and the final second code pattern 38, respectively. Each of the cell regions in the photo mask that corresponds to the binary code value '0' in its related final code pattern is made transparent, and each of the cell regions corresponding to the binary code value '1' is made opaque. The first photo mask 40 and the second photo mask 42 are exposed accordingly and developed, and respectively comprise a plurality of cell regions arranged in a matrix format that corresponds to the plurality of memory cells 52.

Figure 15:
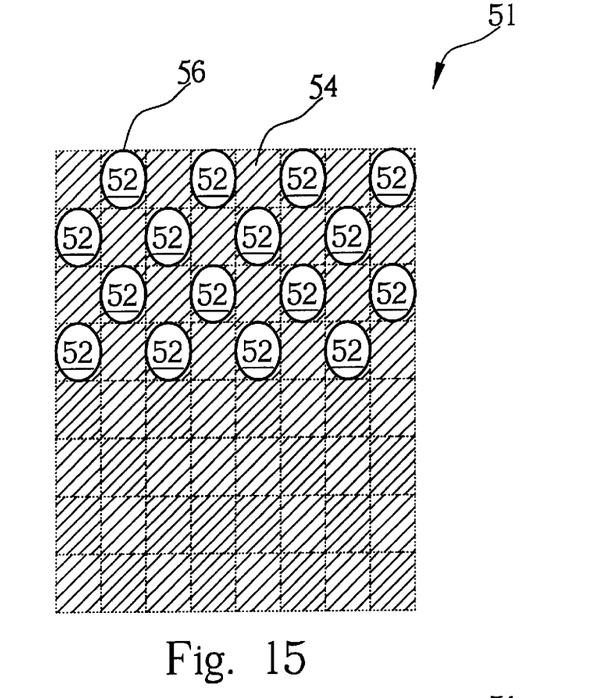
FIG. 15 to FIG. 18 are schematic diagrams of the present invention method for writing the set of binary codes into the ROM by using the first photo mask and the second photo mask.
Figure 16:
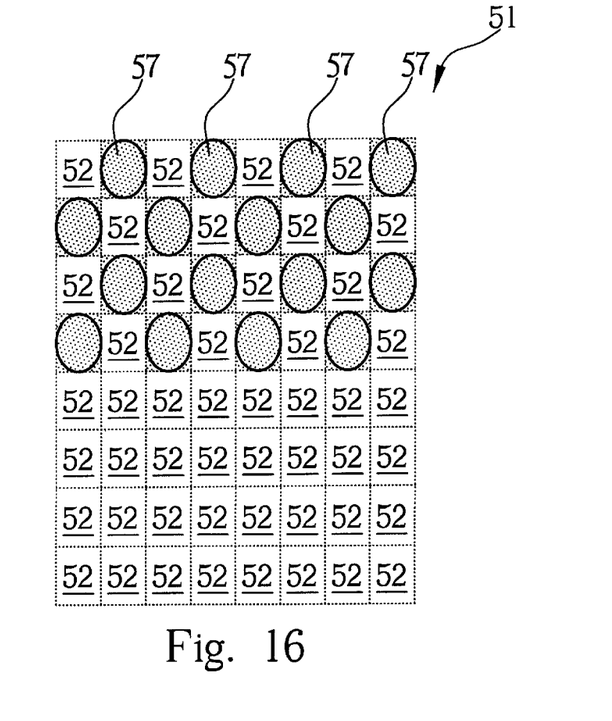

Please refer to FIG. 15 to FIG. 18. FIG. 15 to FIG. 18 are schematic diagrams of the present invention method for writing the set of binary codes 32 onto the ROM 51 using the first photo mask 40 and the second photo mask 42. As shown in FIG. 15, a first photolithographic process is performed using the first photo mask 40 to form a first photoresist layer 54 on the memory cells of the ROM 51, and the distribution of the first photoresist layer 54 corresponds to the opaque regions 44 on the first photo mask 40. The memory cells 52 corresponding to the opaque regions 44 are covered with the first photoresist layer 54. In addition, the first photoresist layer 54 comprises at least one hole 56 and each hole 56 in the first photoresist layer 54 corresponds to its associated transparent region 43. Then, a first ion implantation process is performed using boron as the main dopant. This will cause only the transistors of the memory cells 52 under the holes 56 of the first photoresist layer 54 to undergo ion implantation, forming an ion implantation area 57. This raises the gate threshold voltage of the transistors in the ion implantation areas 57, and they become depletion type transistors that will not be used. This meets part of the design requirements of the ROM 22. Then the first photoresist layer 54 is removed completely, as shown in FIG. 16.

Figure 17:
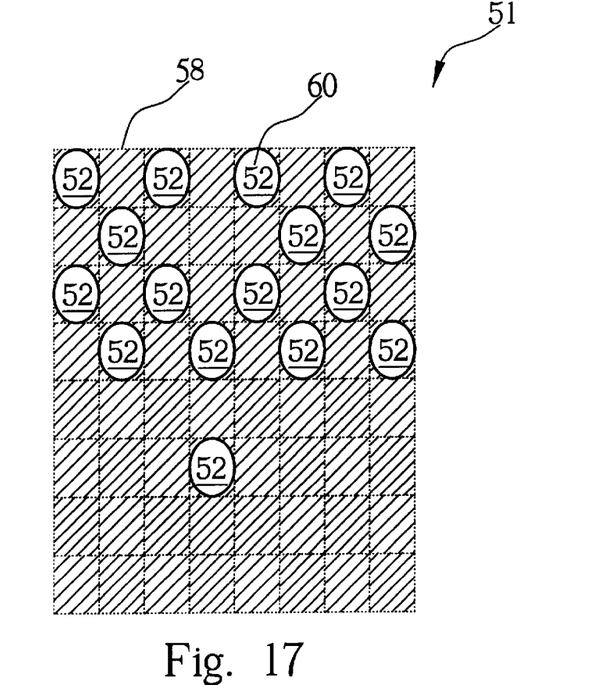
Figure 18:
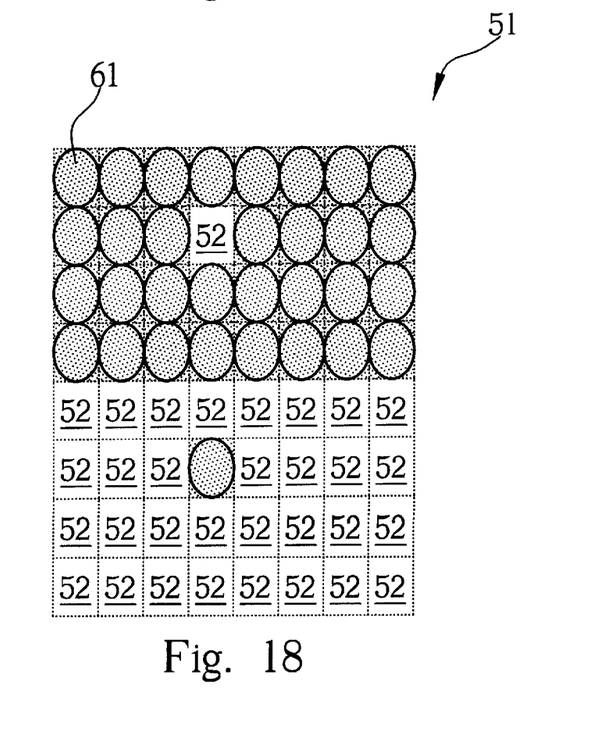

As shown in FIG. 17, the second photolithographic process is performed using the second photo mask 42 to form a second photoresist layer 58 on the memory cells of the ROM 51. The distribution of the second photoresist layer 58 corresponds to the opaque regions 46 arranged in a matrix format on the second photo mask 42. The memory cells 52 corresponding to the opaque regions 46 are covered with the second photoresist layer 58. In addition, the second photoresist layer 58 comprises at least one hole 60 and each hole 60 in the second photoresist layer 58 has a corresponding transparent region 45. A second ion implantation process is performed using boron as the main dopant. This will cause the transistors of the memory cells 52 under the holes 60 of the second photoresist layer 58 to undergo ion implantation, and the second ion implantation area 61 is then formed. Thus, the gate threshold voltage of the transistors in the second ion implantation area 61 is raised, and they become depletion type transistors that will not be used. This fulfills the design requirements of the ROM 22. The second photoresist layer 58 is removed completely, as shown in FIG. 18, and the ROM 51 now contains the set of binary codes 32.

The first and second photolithographic processes, using the first and second photo masks 40, 42 respectively, are performed using the exposure restrictions for transparent regions. That is to say, when performing an exposure process, the focus and the exposure energy are only restricted to remain in the range A of FIG. 6, suitable for holes. As shown in FIG. 6, the process parameter ranges suitable for holes is larger and easier to control than the one suitable for both holes and islands. Optical proximity effects are thereby avoided by the present invention method, and the mask pattern can be transferred onto the ROM 51 precisely. The set of binary codes is thus correctly written onto the ROM 51.

Figure 19:
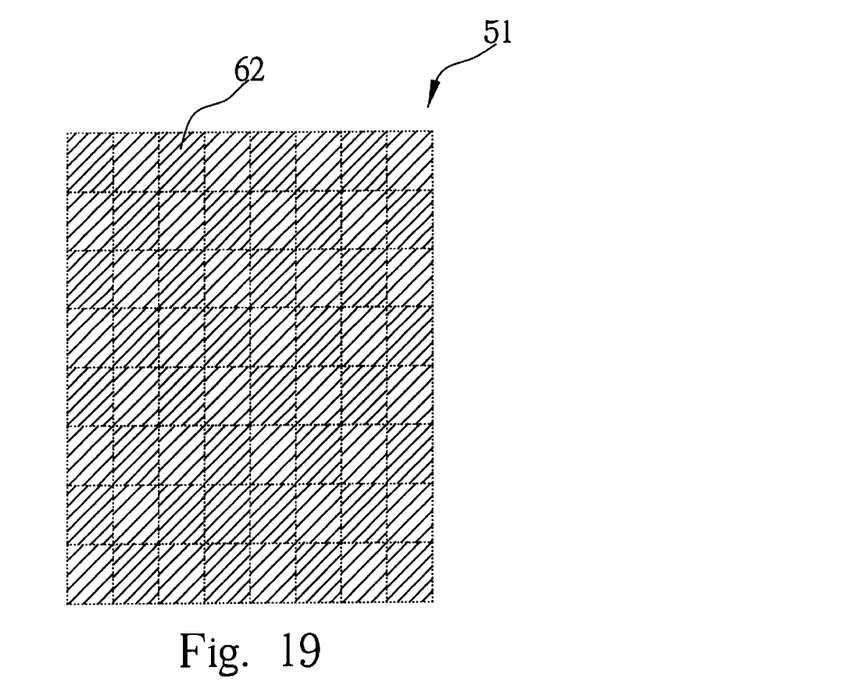
FIG. 19 to FIG. 22 is schematic diagrams of another method of the present invention for writing the set of binary codes into the ROM.
Figure 20:
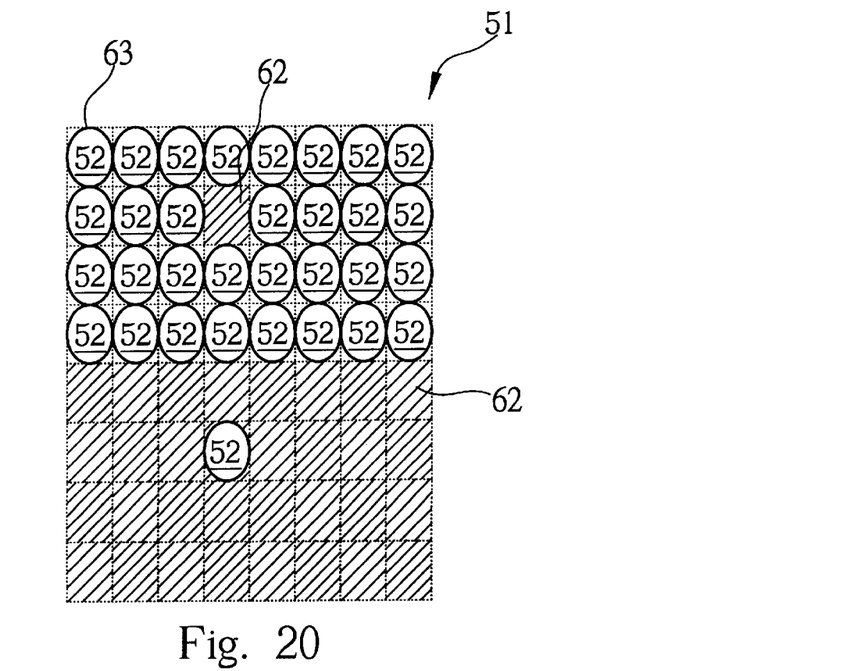
Figure 21:
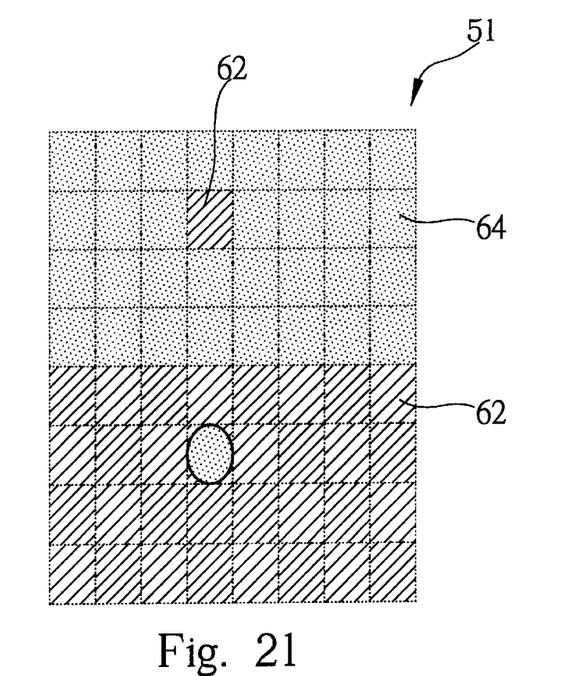
Figure 22:
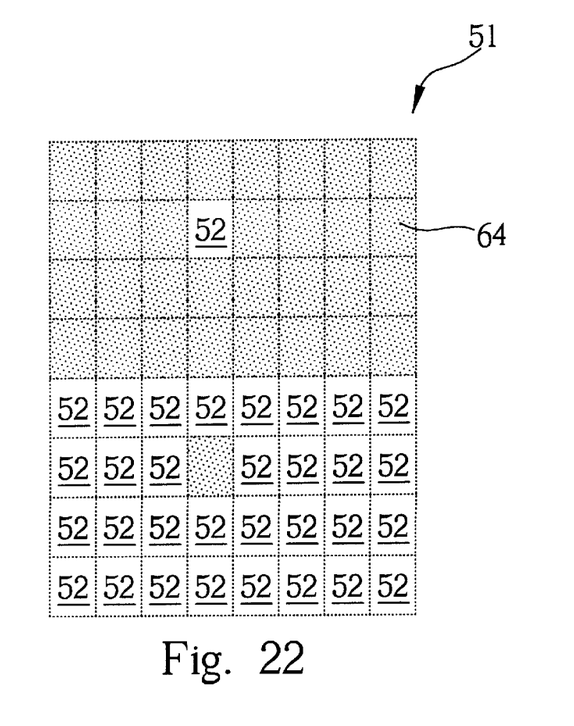

Please refer to FIG. 19 to FIG. 22. FIG. 19 to FIG. 22 are schematic diagrams of an another method of the present invention for writing the set of binary codes 32 onto the ROM 51. First, as described in the previous method, the first photo mask 40 and the second photo mask 42 are formed according to the original first code pattern 30, the original second code pattern 34, and the set of binary codes 32 to be written into the ROM 51. Then a photoresist layer 62 is formed on the surface of the memory cells 52 of the ROM 51, as shown in FIG. 19. A double exposure process is performed on the photoresist layer 62 using the first photo mask 40 and the second photo mask 42, respectively. A development process is then performed on the photoresist layer 62 to form a plurality of holes 63, as shown in FIG. 20. Each of the holes 63 in the photoresist layer 62 is on the surface of the memory cells 52, and corresponds to the transparent regions 43, 45 arranged in a matrix format on the first and second photo masks 40, 42. An ion implantation process is performed, using boron as the main dopant. The transistors of the memory cell 52 under the holes 63 of the first photoresist layer 62 undergo an ion implantation, forming an ion implantation area 64, as shown in FIG. 21. Then the photoresist layer 62 is removed completely, and the ROM 51 is thereby correctly imbued with the set of binary codes, as shown in FIG. 22.

In contrast to the prior art method, the method of writing the set of binary codes into the ROM 51 is performed by forming the first photo mask 40 and the second photo mask 42 according to the original first code pattern 30, the original second code pattern 34, and the set of binary codes 32 to be written into the ROM 51. Each of the binary codes of the original first and second code patterns 30, 34 is different from the four binary codes adjacent to itself. The final first and second code patterns 36, 38 are formed by coupling the binary codes to be written with the original first and second code patterns 30, 34 using a Boolean logical OR operation. The first and second photo mask 40, 42 are formed according to the final first and second code patterns 36, 38. The first photolithographic process is performed using the first photo mask 40, and the first ion implantation process is performed; the second photolithographic process is performed using the second photo mask 42, and the second ion implantation process is performed. Thus the set of binary codes 32 is written into the ROM 51 completely and correctly. In the photolithographic processes, since the exposure process is important only in the transparent regions 43, 45 of the first and second photo mask 40, 42, the process parameter ranges of focus and exposure energy are larger and more easily controlled. Hence, the patterns on the first and second photo mask 40, 42 are transferred onto the ROM 51 precisely, and the set of binary codes 32 is written onto the ROM 51 correctly.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of writing a set of binary codes into a read-only memory (ROM), the ROM being formed on a die and comprising a plurality of memory cells arranged in a matrix format on the die, each memory cell comprising a MOS transistor, the method comprising:

forming a first photo mask and a second photo mask which respectively comprises a plurality of cell regions arranged in a matrix format and corresponding to the plurality of memory cells respectively, each of the cell regions being set as a transparent region or an opaque region, the first photo mask and the second photo mask being formed by using an original first code pattern, an original second code pattern and the set of binary codes to be written into the ROM, the original first code pattern and the original second code pattern respectively comprising a set of binary codes arranged in a matrix format and corresponding to the cell regions of the two photo masks, each of the binary codes of the two code patterns corresponding to the same cell region being different from each other, each of the binary codes to be written into the ROM being coupled to each corresponding binary code of the two code patterns by using a Boolean logical OR operation so as to form a final first code pattern and a final second code pattern respectively, the first photo mask and the second photo mask being formed by using the final first code pattern and the final second code pattern respectively, wherein whether each of the cell regions on the first photo mask or on the second photo mask is a transparent region or an opaque region is decided by each corresponding binary code of the final first code pattern or the final second code pattern;

performing a first photolithography process by using the first photo mask to form a first photoresist layer on the memory cells of the ROM, the first photoresist layer comprising at least one hole and each hole in the first photoresist layer corresponding to a cell region of the first photo mask and being positioned on the surface of the memory cell corresponding to the cell region;

performing a first ion implantation process to implant dopants into the transistor in the memory cell under each hole of the first photoresist layer;

removing the first photoresist layer completely;

performing a second photolithography process by using the second photo mask to form a second photoresist layer on the memory cells of the ROM, the second photoresist layer comprising at least one hole and each hole in the second photoresist layer corresponding to a cell region of the second photo mask and being positioned on the surface of the memory cell corresponding to the cell region;

performing a second ion implantation process to implant dopants into the transistor in the memory cell under each hole of the second photoresist layer; and removing the second photoresist layer completely.

2. The method of claim 1 wherein the binary codes of the original first code pattern and the original second code pattern are arranged in a matrix format and each of the binary codes is adjacent to four binary codes of different value.

3. The method of claim 1 wherein the first and second ion implantation processes are used for adjusting the gate threshold voltage of the transistors under the holes of the first and second photoresist layers.

4. The method of claim 1 wherein the transistor is an N-type transistor.

5. The method of claim 1 wherein the first and second ion implantation processes employ boron (B) as the main dopant.

6. A method of writing a set of binary codes into a read-only memory (ROM), the ROM being formed on a die and comprising a plurality of memory cells arranged in a matrix format on the die, each memory cell comprising a MOS transistor, the method comprising:

forming a first photo mask and a second photo mask which respectively comprises a plurality of cell regions arranged in a matrix format and corresponding to the plurality of memory cells respectively, each of the cell regions being set as a transparent region or an opaque region, the first photo mask and the second photo mask being formed by using an original first code pattern, an original second code pattern and the set of binary codes to be written into the ROM, the original first code pattern and the original second code pattern respectively comprising a set of binary codes arranged in a matrix format and corresponding to the cell regions of the two photo masks, each of the binary codes of the two code patterns corresponding to the same cell region being different from each other, each of the binary codes to be written into the ROM being coupled to each corresponding binary code of the two code patterns by using a Boolean logical OR operation so as to form a final first code pattern and a final second code pattern respectively, the first photo mask and the second photo mask being formed by using the final first code pattern and the final second code pattern, wherein whether each of the cell regions on the first photo mask or on the second photo mask is a transparent region or an opaque region is decided by each corresponding binary code of the final first code pattern or the final second code pattern;

forming a photoresist layer on the memory cells of the ROM;

performing a double exposure on the photoresist layer using the first photo mask and the second photo mask respectively;

performing a developing process to form a plurality of holes in the photoresist layer, each hole in the photoresist layer corresponding to one of the cell regions and being positioned on the surface of the memory cell corresponding to the cell region; and performing an ion implantation process to implant dopants into the transistor under each of the holes of the photoresist layer.

7. The method of claim 6 wherein the binary codes of the original first code pattern and the original second code pattern are arranged in a matrix format and each of the binary codes is adjacent to four binary codes of different values.

8. The method of claim 6 wherein the ion implantation process is used for adjusting the gate threshold voltage of the transistors of the memory cells under the holes of the photoresist layer.

9. The method of claim 6 wherein the transistor is a N-type transistor.

10. The method of claim 6 wherein the ion implantation process employs boron (B) as the main dopant.

* * * * *